United States Patent [19]

Barnett

[11] Patent Number: 4,544,799

[45] Date of Patent: Oct. 1, 1985

[54] WINDOW STRUCTURE FOR PASSIVATING SOLAR CELLS BASED ON GALLIUM ARSENIDE

[75] Inventor: Allen M. Barnett, Newark, Del.

[73] Assignee: University of Delaware, Newark, Del.

[21] Appl. No.: 605,038

[22] Filed: Apr. 30, 1984

[51] Int. Cl.$^4$ .............................................. H01L 31/06
[52] U.S. Cl. .................................... 136/262; 136/256; 357/30; 357/52
[58] Field of Search ....................... 136/256, 255, 262; 357/30, 52

[56] References Cited

U.S. PATENT DOCUMENTS

| | | | |
|---|---|---|---|
| 3,565,702 | 2/1971 | Nelson | 148/172 |
| 3,675,026 | 7/1972 | Woodall | 250/211 J |
| 3,993,506 | 11/1976 | Moon | 136/262 |
| 4,107,723 | 8/1978 | Kamath | 357/30 |
| 4,179,308 | 12/1979 | Olsen | 136/262 |
| 4,404,421 | 9/1983 | Fraas | 136/249 |

FOREIGN PATENT DOCUMENTS 82-8384  10/1983  South Africa .

OTHER PUBLICATIONS

H. J. Hovel et al., "Solar Cell Structures", *IBM Tech. Disc., Bull.*, vol. 16, pp. 2079–2080 (1973).

R. T. Hodgson et al., "High Bandgap, High Efficiency, High Temperature Solar Cell", *IBM Tech. Disc. Bull.*, vol. 22, p. 416 (1979).

*Primary Examiner*—Aaron Weisstuch
*Attorney, Agent, or Firm*—John A. Parkins

[57] ABSTRACT

Passivated gallium arsenide solar photovoltaic cells with high resistance to moisture and oxygen are provided by means of a gallium arsenide phosphide window graded through its thickness from arsenic rich to phosphorus rich.

4 Claims, No Drawings

WINDOW STRUCTURE FOR PASSIVATING SOLAR CELLS BASED ON GALLIUM ARSENIDE

The Government of the United States of America has certain rights to this invention pursuant to NASA Contract NAG-321, NASA-CR-170005.

FIELD OF THE INVENTION

This invention relates to gallium arsenide photovoltaic solar cells which have a surface passivating, window layer of gallium arsenide-phosphide graded from arsenic rich to phosphorus rich interposed between the gallium arsenide and a transparent electrical contact.

BACKGROUND

Photovoltaic solar cells are semiconductor junction devices which convert light energy to electrical energy. Typically, such solar cells have layered structures comprising at least four layers:
(1) an absorber-generator;
(2) a collector-converter;
(3) a transparent electrical contact; and
(4) an opaque electrical contact.

When light is incident upon a structure comprising these elements in an appropriate relationship, it creates a voltage and an electrical current which increases as the intensity of the incident light increases.

The absorber-generator (referred to as the absorber) is a layer of semiconductor material which absorbs light (photons), creating a pair of charged particles which are negatively charged carriers (electrons) and positively charged carriers (holes). In p-type semiconductors, the electrons are minority carriers and in n-type semiconductors, the holes are minority carriers. Minority carriers are readily annihilated in the absorber by recombination with majority carriers. Accordingly, they must be transported to a region where they can be converted and survive as carriers.

The collector-converter (the collector) is a layer in electrical contact with the absorber. This layer collects minority carriers from the absorber and converts them to majority carriers, the genesis of the electric current for utilization. The lifetime of minority carriers should be sufficiently long for diffusion across the absorber to the junction of the absorber and the collector. Further, the bandgap of the absorber should be of an energy to maximize energy conversion efficiency.

The transparent contact is an electrically conductive optically transparent layer in ohmic (electrical) contact with the collector. This element is generally a metallic grid covering less than 5% of the solar cell area, which makes it effectively 95% transparent.

Finally, the opaque electrical contact is a layer on the side of the absorber-collector junction opposite the incident light, i.e., in contact with the collector completing the electrical circuit through the cell.

A criterion which must be met for all of the layers is that there should be a reasonable lattice match at all the active layer (absorber and collector) interfaces as well as a reasonable match in the coefficient of thermal expansion. This is necessary to minimize any interfacial strains that might arise during epitaxial growth. A mismatch in lattice constant can lead to the creation of interface states which may, in turn, place limits on the short circuit current and open circuit voltage through increases in carrier recombination at the absorber-collector junction if these interface states are created in the junction region. Strains can be propagated from the window-collector interface, through the collector to the collector-absorber junction where they can increase minority carrier recombination.

In the art, gallium arsenide (GaAs) has been found to be one of the most efficient semiconductor materials for solar cells. It can be doped as either an n-type or p-type semiconductor, so that the absorber and collector can be of the same material. A highly efficient solar cell has been made using gallium aluminum arsenide (either $Ga_{1-x}Al_x$)As or simply (GaAl)As) as a window material, as disclosed in U.S. Pat. No. 3,675,026 to Woodall, July 4, 1972. This window material (on GaAs cells) has a very good transparent over the parts of the solar spectrum which can be absorbed by gallium arsenide, has a good lattice match and a similar coefficient of thermal expansion. In preparation of solar cells and in use in terrestrial conditions, however, it is deficient as a result of its hygroscopic nature and oxygen sensitivity. It is also difficult to make an ohmic transparent contact to (GaAl)As. This requires fabrication of the solar cell in a moisture-free atmosphere and protection of the completed device. In use under atmospheric conditions, this deficiency leads to deterioration of the cell. A window material resistant to moisture, but otherwise satisfying the other requirements, would greatly increase the useful life of GaAs solar cells.

OBJECTS OF THE INVENTION

It is an object of this invention to provide a photovoltaic solar cell based on gallium arsenide which has high efficiency, is resistant to atmospheric moisture and can readily lead to a good ohmic contact with the transparent contact.

It is another object of this invention to provide a stable, transparent window material with a reasonable lattice match for gallium arsenide photovoltaic solar cells.

It is still another object of this invention to provide a passivating window material of graded composition gallium arsenide phosphide on a gallium arsenide absorber layer.

SUMMARY OF THE INVENTION

This invention provides window materials for gallium arsenide solar cells which possess the essential properties of gallium aluminum arsenide but without the undesirable sensitivity to oxygen and moisture. In particular, it provides a gallium arsenide phosphide window layer which is resistant to the action of moisture but suffers only a slight loss in photovoltaic efficiency. This improvement in the solar cell is provided by a graded composition gallium arsenide phosphide window layer which serves as a connection between the gallium arsenide absorber layer and a gallium phosphide-rich passinating portion at the outer surface of the window layer. Thicknesses of layers are optimized to provide for most efficient absorption of radiation, along with minimum losses by carrier recombination at interfaces and high values of open-circuit voltage and short-circuit current.

DETAILED DESCRIPTION

Selection of the photovoltaic junction materials, i.e., the absorber and collector layers, essentially fixes certain criteria or requirements for the other layers of the solar cell, as indicated generally in the foregoing background.

These criteria which should be met include:

(1) Facility with which the material can be doped to obtain the required conductivity type (n-type or p-type);
(2) Having a lattice constant near that of the absorber and collector layers;
(3) A low recombination velocity of carriers at the surface of the specific materials chosen;
(4) A thickness consistent with high optical transmission of the appropriate solar spectrum and a low surface recombination velocity;
(5) In general, although not specifically dictated by the choice of the photovoltaic junction material, the material should be resistant to ambient conditions, e.g., atmospheric moisture and oxygen; and
(6) Ohmic contacts must be easy to fabricate.

The maintenance of an alternating conductivity type sequence, n-p, p-n, n-n-p-p, p-p-n-n, n-n-p etc., is facilitated by the capacity of GaAs to be doped as either a p-type or n-type. For p-type GaAs, germanium (Ge) and zinc (Zn) are suitable dopants. For n-type GaAs, tin (Sn), sulfur (S) tellurium (Te) and silicon (Si) are suitable dopants. Because p-type GaAs has a larger current collection capability than n-type GaAs, the choice of p-type conductivity for the absorber is slightly preferred. In regard to doping, GaAlAs is a desirable window material, since doping can be transferred across the interface with the GaAs collector to achieve the same conductivity type as required by the foregoing criteria.

The need for close conformity of lattice constants of GaAs and GaAlAs is well satisfied, both being 5.653 Angstroms at 300° K., which partially accounts for the efficiency of the Woodall cell. A mismatch could place limits on the short-circuit current and open-circuit voltage by increased recombination of carriers at the interface if misfit dislocations are propagated to the junction.

The window should have as high a bandgap as possible and at the same time be as thin as possible to insure that most of the light passes through the window instead of being absorbed by it, as is achieved by GaAlAs.

Transparency is dependent upon thickness; since GaAlAs is optically quite clear and can be deposited expitaxially in extremely thin layers, it is quite satisfactory in this respect.

A major deficiency of (GaAl)As as a window material is in its lack of resistance to oxygen and moisture, essentially atmospheric conditions. This arises from the highly hygroscopic nature of alumunim arsenide. This not only impairs the function of the window itself, i.e., transparency and electrical contact with the absorber, but also makes electrical contact difficult.

This invention provides means free of this moisture resistance deficiency of GaAlAs as a window material for GaAs solar cells, comprising:

(1) a gallium arsenide phosphide window layer with a portion rich in gallium arsenide in contact with the GaAs layer; and
(2) a gallium phosphide-rich portion at the outer surface of the window.

Preferably, the gallium phosphide-rich portion of the window is extremely thin to provide high efficiency over the entire solar spectrum.

Gallium phosphide does not have a good match of lattice constant with gallium arsenide. The lattice constants for GaP and GaAs at 300° K. are 5.451 and 5.653 Angstroms, respectively, which is a mismatch of approximately 4%. If this window layer need not have a photovoltaic function, only serving as an electrically conductive and optically transparent element, the strains and dislocations are largely confined to the window and are not be propagated to the junction, they are without significant effect on recombination and efficiency.

The optical transparency of GaP over the solar spectrum is almost as good as that of GaAlAs: the absorption of a window of GaP 0.05 microns thick reduces the current density by 0.56 mA/cm$^2$ while a window of 0.05 micron $Ga_{0.15}Al_{0.85}As$ reduces it by 0.4 mA/cm$^2$ at doping levels of $10^{19}$. The response over the solar spectrum of a GaAs solar cell varies with the thickness of its gallium phosphide window so that as the thickness diminishes, the solar cell output in the shorter wavelength (below 0.5 micron) parts of the spectrum increases significantly. By utilization of thin windows of GaP, the output of cells with GaP windows approaches that of cells with conventional GaAlAs windows. A further advantage of thin windows of GaP is that some of the carriers generated in the window may diffuse through the interface with the collector and add to the carriers generated in that layer, increasing the response at higher photon energies.

The major deficiency, mentioned previously, of the aluminum-containing composition (GaAlAs) as window material for aluminum arsenide solar cells is that even very slight hydrolysis to form aluminum oxides can lead to poor electrical contacts and unacceptably high resistance. Accodingly, gallium aluminum arsenide layers are usually grown and handled in a dry, inert atmosphere. In the absence of aluminum or other readily oxidized or hydrolyzed components, as in solar cells passivated with GaP, there is no need to grow them in a highly inert atmosphere, since the stability in the atmosphere in use is good, and electrical contacts are easily made.

In accordance with the objectives of the invention it is useful to have a cell with the desirable properties of the GaP window material but without reduced efficiency attributable to the lattice mismatch and lower transparency of GaP. It has been found in the present invention that a layer which is graded from substantially pure GaP to substantially pure GaAs through its thickness provides properties better than the direct GaP to GaAs interface. The effects of the lattice mismatch between GaP and GaAs are reduced, and, by optional limitation of the phosphorus-rich portion to a very small thickness, the transparency is very high. The arsenic-rich portion of the layer is in contact with the photovoltaically active layer of the solar cell and the phosphorus-rich portion at the remote portion of the window.

Cells and windows of this invention are prepared by processes known to the art, expitaxially from the vapor or from a solution such as by a sliding boat method as in U.S. Pat. No. 3,565,702, Feb. 23, 1971, to Nelson or South Africa 82/8384, Nov. 16, 1983, to Barnett, the former incorporated herein by reference.

The essential material of the Nelson patent includes the disclosure of a method for making solar-cell quality semiconductors which are grown by using a sliding boat containing a liquid solution of the semiconductor and a metal. My South African patent further discloses driving the growth of the semiconductor by application of a temperature gradient or other gradient, such as electrical, across the melt to the substrate, e.g., with the surface of the growing semiconductor at a lower temperature than the solution.

The growth of GaP from the liquid can be done using molten tin as a solvent for n-type GaP or molten germanium as a solvent for p-type conductivity. The growth of the graded gallium arsenide phosphide window layer on GaAs is conveniently done using the same technique but at a slower growth rate so that some of the GaAs absorber layer is dissolved and grown again as GaAsP.

In one embodiment, for example, a graded layer is grown on GaAs from saturated solutions of the material (GaP) in the appropriate molten metal solvent (tin or germanium) for both GaP and GaAs. The surface of the GaAs layer upon which growth takes place is maintained at a lower temperature than the solution so that the GaP deposits and grown on the GaAs surface. The GaAs layer is initially at a temperature only slightly lower than that of the solution, so that initially by dissolution and re-growth, the process forms ternary GaAsP at the GaAs surface. The temperature difference between the layer and the solution is then increased by further cooling of the layer so that substantially pure GaP is finally deposited. Temperatures and other conditions are selected to achieve growth rates of 0.1 micron to 2 microns per minute.

To minimize the number of photons absorbed by gallium phosphide, as mentioned hereinbefore, the thickness of the portion of the graded window rich in this passivating component should be thin. Thickness less than 1.0 micrometer are preferred, and even less than 0.05 micrometer is effective to provide passivation and high photovoltaic efficiency.

The layers can also be grown by vapor-phase epitaxy, in which the graded GaAsP can be done by varying the flux of the vapor of the components.

It is understood that the graded GaP-GaAs layer may be used alone as a passivating window on GaAs solar cells, or it may be interposed between a layer of GaP and the GaAs layer of the cell.

I claim:

1. A gallium arsenide photovoltaic device with a layered structure having a window layer of gallium arsenide phosphide graded from an arsenic-rich portion in contact with the adjacent photovoltaically active gallium arsenide layer to a phosphorus-rich portion remote from the photovoltaically active layer.

2. The photovoltaic device of claim 1 wherein the phosphorus-rich portion of the window layer has a thickness less than 1.0 micrometer.

3. The photovoltaic device of claim 2 wherein the thickness of the phosphorus-rich portion has a thickness of less that 0.05 micrometer.

4. A photovoltaic solar cell having a layered structure comprising in order, a transparent electrical contact, an optically transparent window layer, a gallium arsenide absorber-generator layer, a gallium arsenide collector-converter layer, wherein the absorber-generator and the collector-converter layers respectively are doped to provide opposite conductivity types, and an optically opaque electrically conductive layer, wherein the optically transparent window layer is gallium arsenide phosphide graded from a phosphorus-rich portion in contact with transparent electrical contact and an arsenic-rich portion in contact with the gallium arsenide absorber-generator layer.

* * * * *